United States Patent
Na

(10) Patent No.: US 8,553,480 B2
(45) Date of Patent: Oct. 8, 2013

(54) LOCAL IO SENSE ACCELERATOR FOR INCREASING READ/WRITE DATA TRANSFER SPEED

(75) Inventor: One-Gyun Na, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 396 days.

(21) Appl. No.: 13/111,958

(22) Filed: May 20, 2011

(65) Prior Publication Data

US 2012/0294098 A1 Nov. 22, 2012

(51) Int. Cl.
*G11C 7/08* (2006.01)

(52) U.S. Cl.
USPC ........... 365/204; 365/205; 365/208; 365/207; 365/190; 365/196; 365/189.14; 365/189.17; 365/189.05

(58) Field of Classification Search
USPC ......... 365/190, 196, 194, 191, 203, 204, 205, 365/208, 207, 189.14, 189.17, 189.05
See application file for complete search history.

(56) References Cited

U.S. PATENT DOCUMENTS

| 6,738,300 B2 * | 5/2004 | Barth, Jr. ................... 365/203 |
| 2013/0051163 A1 * | 2/2013 | Koike .................... 365/189.15 |

* cited by examiner

*Primary Examiner* — Andrew Q Tran
(74) *Attorney, Agent, or Firm* — Winston Hsu; Scott Margo

(57) ABSTRACT

A memory array includes: at least one differential local bit line pair; at least one differential global bit line pair; at least a column selection signal, for charging the differential local bit line pair to a predetermined voltage; at least an enable signal for coupling the differential local bit line pair to the differential global bit line pair when a voltage of the differential local bit line pair reaches a specific value; and a local sense accelerator, coupled to the differential local bit line pair, for determining a voltage of the differential local bit line pair, and enabling an accelerator signal for latching one of the differential local bit line pair and pulling the other low when the voltage reaches the specific value.

16 Claims, 5 Drawing Sheets

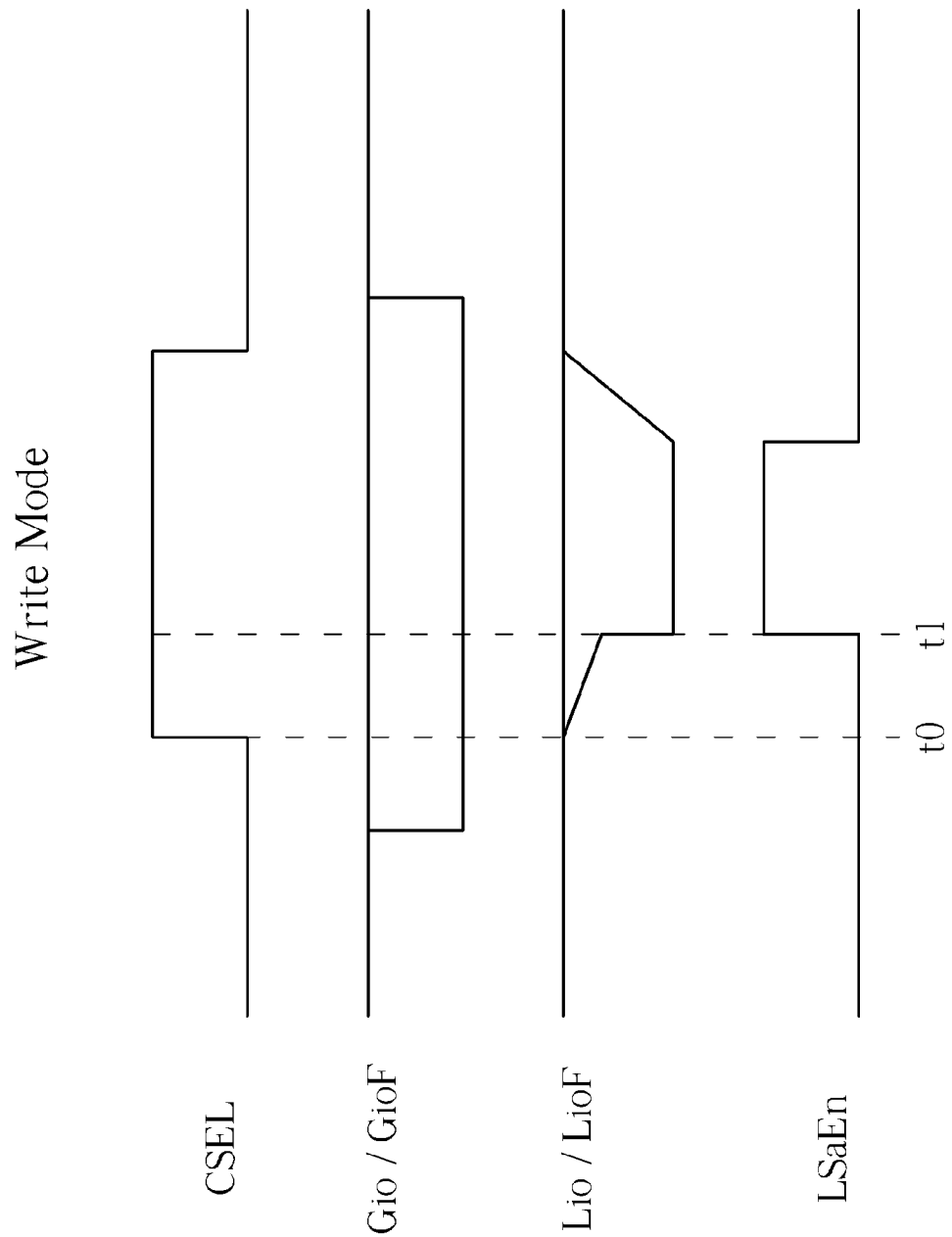

LOCAL IO SENSE ACCELERATOR FOR INCREASING READ/WRITE DATA TRANSFER SPEED

BACKGROUND

The present application relates to a memory array, and more particularly, to a memory array comprising a local sense accelerator that can increase the speed of data transfer during read and write processes.

A conventional semiconductor memory array contains both global (or "main") word and bit lines and local (or "sub") word and bit lines. Read and write processes are performed by transferring data from the global bit lines to the local bit lines and vice versa. Access to the bit lines is facilitated by the word lines.

For example, FIG. 1 illustrates a conventional memory array 100. As shown in the diagram, the memory array 100 comprises differential local I/O lines, Lio and LioF, coupled to differential global I/O lines, Gio and GioF, by means of a plurality of transistors. For simplicity, only single differential pairs of global and local I/O lines are shown.

In operation, during a conventional read process, the local bit lines are pre-charged, meaning they contain a particular value. A column selection signal CSEL (see $t_0$ in timing diagram of FIG. 2) is fired, which selects a specific word line. This causes the corresponding differential bit lines, Lio and LioF, to "mature," meaning that one line discharges such that separation between Lio and LioF occurs (see Lio/LioF between $t_0$ and $t_2$ in timing diagram of FIG. 2). The lines have to reach a predetermined separation for a read process to begin (see $t_1$ in timing diagram of FIG. 2). This separation frequently is about 300 mV. Therefore the memory array 100 also includes a current sense amplifier. This current sense amplifier detects a small current on the bit lines, converts the current to a voltage, and amplifies this voltage such that a stored value can be read from the memory. When the voltage reaches the minimum separation, the current sense amplifier fires a Read Enable signal (RdEn), which activates the transistors between the local and global lines, thereby allowing data transfer.

For a write process, values to be written to a local bit line are present on the global bit line. The CSEL signal (FIG. 2) is fired to select the appropriate word line, and the corresponding local bit lines begin to separate. When the current sense amplifier detects that the separation has reached approximately 300 mV, a write enable signal (WrEn) may be fired, which drives the global bit line values onto the local bit lines.

The timing of the CSEL signal and the corresponding separation of the bit lines for a read process is illustrated in FIG. 2. As shown in the diagram, the separation of the local bit lines is slow and gradual (see Lio/LioF at times $t_0$, $t_1$, and $t_2$ in timing diagram of FIG. 2). Generally speaking, in order for fast read processes to occur, the voltage on the local bit lines should be as high as possible. In modern memory arrays, however, the circuit layout is often quite small, meaning that the current sense amplifier is also small and the amplification of the voltage is therefore limited.

Write processes are plagued by a similar set of problems. Additionally, an accepted phenomenon in the art is that as line length increases, so does line capacitance. In conventional memory arrays 100, the local bit lines are quite long, and therefore have a relatively large line capacitance. This phenomenon contributes in turn to the slow separation of the differential local bit lines, Lio and LioF (as seen in the Lio/LioF lines of FIG. 2), and thus causes a heavy loading problem when data is driven from the global bit lines, Gio and GioF, to the local bit lines, Lio and LioF.

In summary, characteristics of conventional memory design, such as the necessity for small sense amplifiers and the existence of line-based capacitances, induce inevitable problems with regards to read and write processes. It is therefore a priority in this field to design a system that can speed up the separation of the local bit lines.

SUMMARY

The systems and methods disclosed herein advantageously provide a memory array architecture that may accelerate separation between the local bit lines in order to increase the speed of read and write operations as well as reduce the power consumption of these processes.

In one embodiment, a memory array comprises: at least one differential local bit line pair; at least one differential global bit line pair; at least a column selection signal line, for charging the differential local bit line pair to a predetermined voltage; at least an enable signal line for coupling the differential local bit line pair to the differential global bit line pair when a voltage of the differential local bit line pair reaches a specific value; and a local sense accelerator, coupled to the differential local bit line pair, for determining a voltage of the differential local bit line pair, and enabling an accelerator signal line for latching one of the differential local bit line pair and pulling the other low when the voltage reaches the specific value.

In another embodiment, a method for accelerating data transfer in a memory array comprises: providing at least one differential local bit line pair; providing at least one differential global bit line pair; generating a column selection signal to charge the differential local bit line pair to a predetermined value; generating an enable signal to couple the differential local bit line pair to the differential global bit line pair when the voltage of the differential local bit line pair reaches a specific value; and enabling an accelerator signal for latching one of the differential local bit line pair and pulling the other low when the voltage reaches the specific value.

In another embodiment, a memory array with a local acceleration block includes: at least one differential local bit line pair, at least one differential global bit line pair coupled to the at least one differential local bit line pair, and at least one enable line coupled to either the local bit line pair or the global bit line pair. The local acceleration block is configured to selectively latch one of the differential local bit lines at a high voltage value while causing the other differential local bit line to go to a low voltage value.

These and other embodiments of the present application will be discussed more fully in the detailed description. The features and advantages may be achieved independently in various embodiments of the present application, or may be combined in yet other embodiments.

BRIEF DESCRIPTION OF THE DRAWINGS

FIG. 5 is a timing diagram showing the relation between firing of signals and column separation for a write process of the memory array shown in FIG. 3.

DETAILED DESCRIPTION

In the following detailed description, reference is made to the accompanying drawings that form a part hereof, and in which is shown by way of illustration specific embodiments in which the disclosure may be practiced. These embodiments are described in sufficient detail to enable those skilled in the art to practice the disclosure, and it is to be understood that other embodiments may be utilized and that various changes may be made without departing from the spirit and scope of the present application.

The present application discloses a new memory array layout that may eliminate many of the speed limitations inherent in conventional memory arrays. The systems and memories described herein promote rapid separation between the local bit lines, and thereby increase the speed of data transfer and reduce power consumption for both read and write processes.

Figure 1:
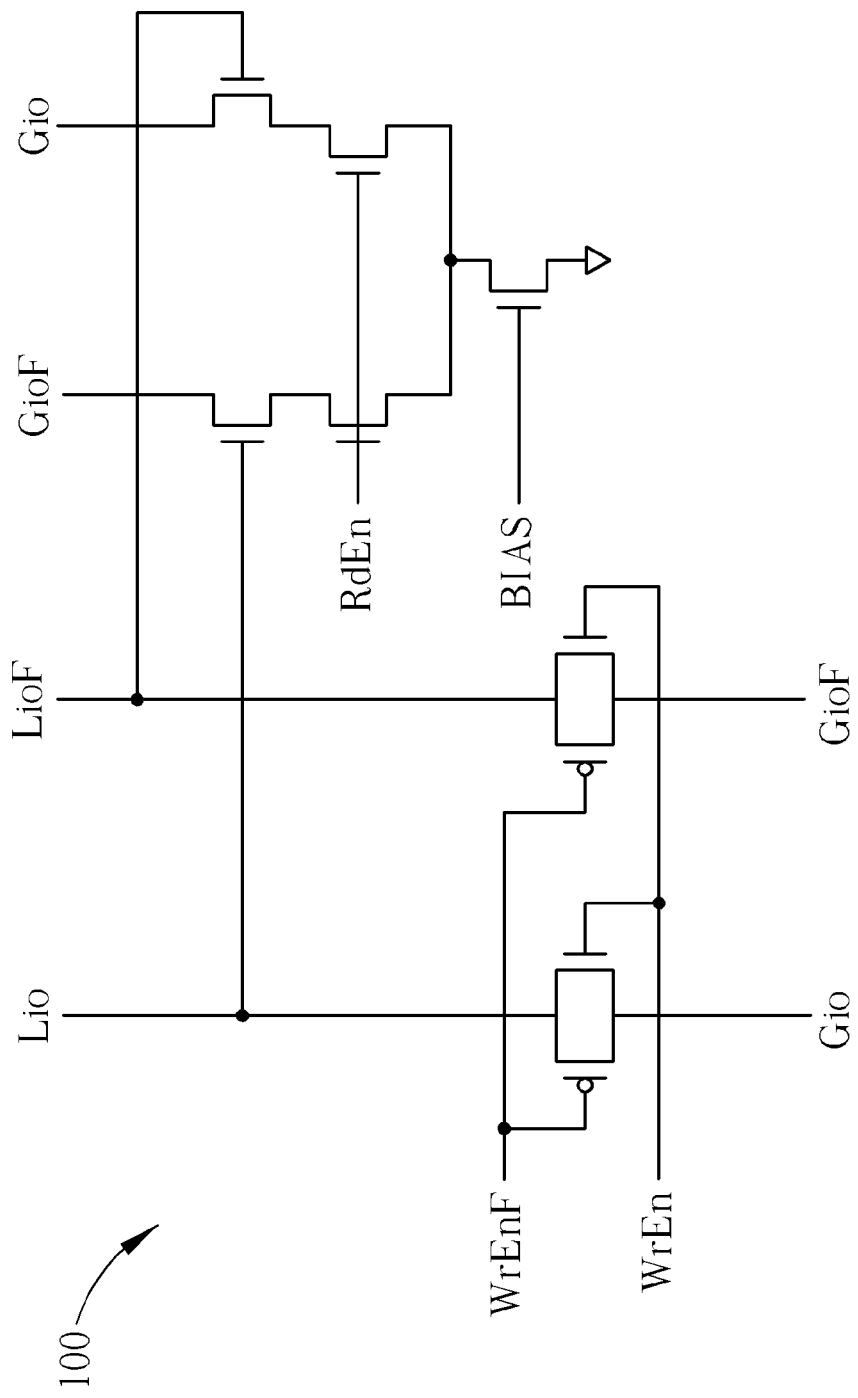
FIG. 1 is a diagram of a conventional memory array layout.
Figure 2:
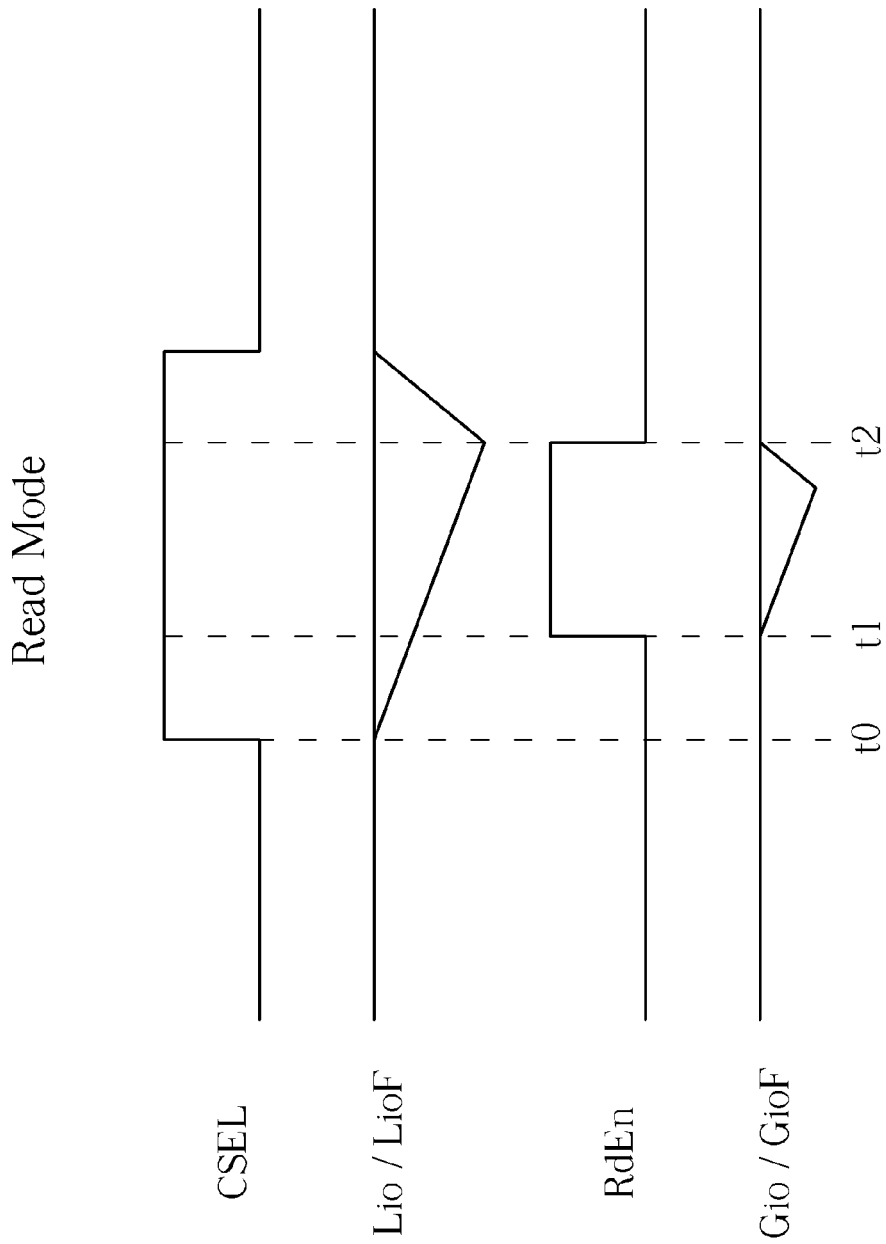
FIG. 2 is a timing diagram showing the relation between firing of signals and column separation for the conventional memory array shown in FIG. 1.
Figure 3:
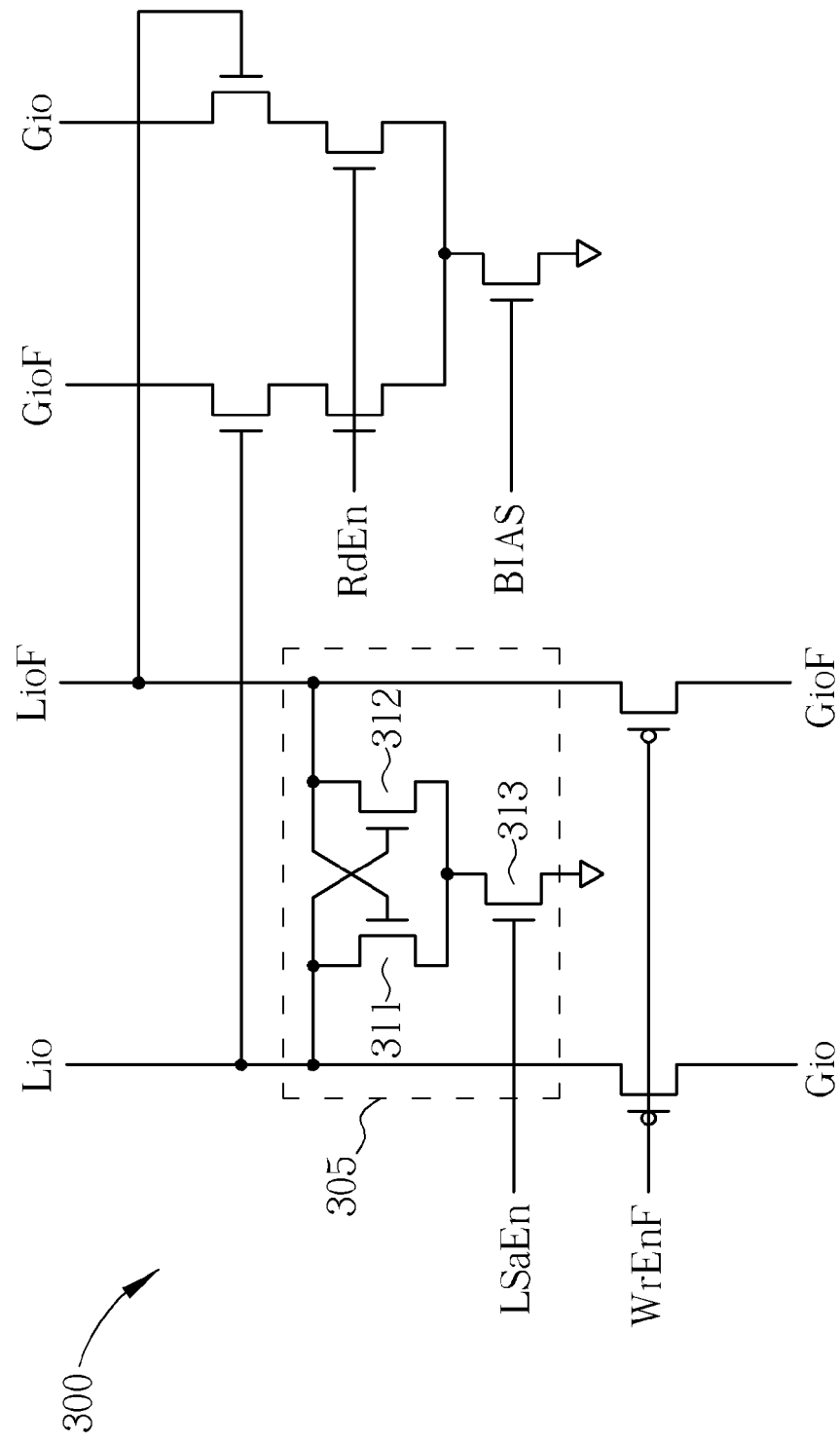
FIG. 3 is a diagram of a memory array layout according to an exemplary embodiment of the present application.

FIG. 3 illustrates one exemplary embodiment of a memory array layout 300 according to the current application. The memory array 300 includes differential local bit lines, Lio and LioF, coupled to differential global bit lines, Gio and GioF. A read enable and a write enable line are each coupled to a transistor pair on the differential global and local bit lines. The memory array 300 also includes a local sense accelerator 305. The local sense accelerator 305 comprises two cross-coupled transistors, 311 and 312, coupled between the local bit lines, Lio and LioF, further having their drains coupled to the source of a third transistor 313 which is then coupled to ground, and has a signal LSaEn line coupled to its gate. The cross-coupled transistors, 311 and 312, are configured such that the gate of 311 is coupled to the source of 312 and to one of the differential local bit lines, while the gate of 312 is coupled to the source of 311 and the other differential local bit line.

Figure 4:
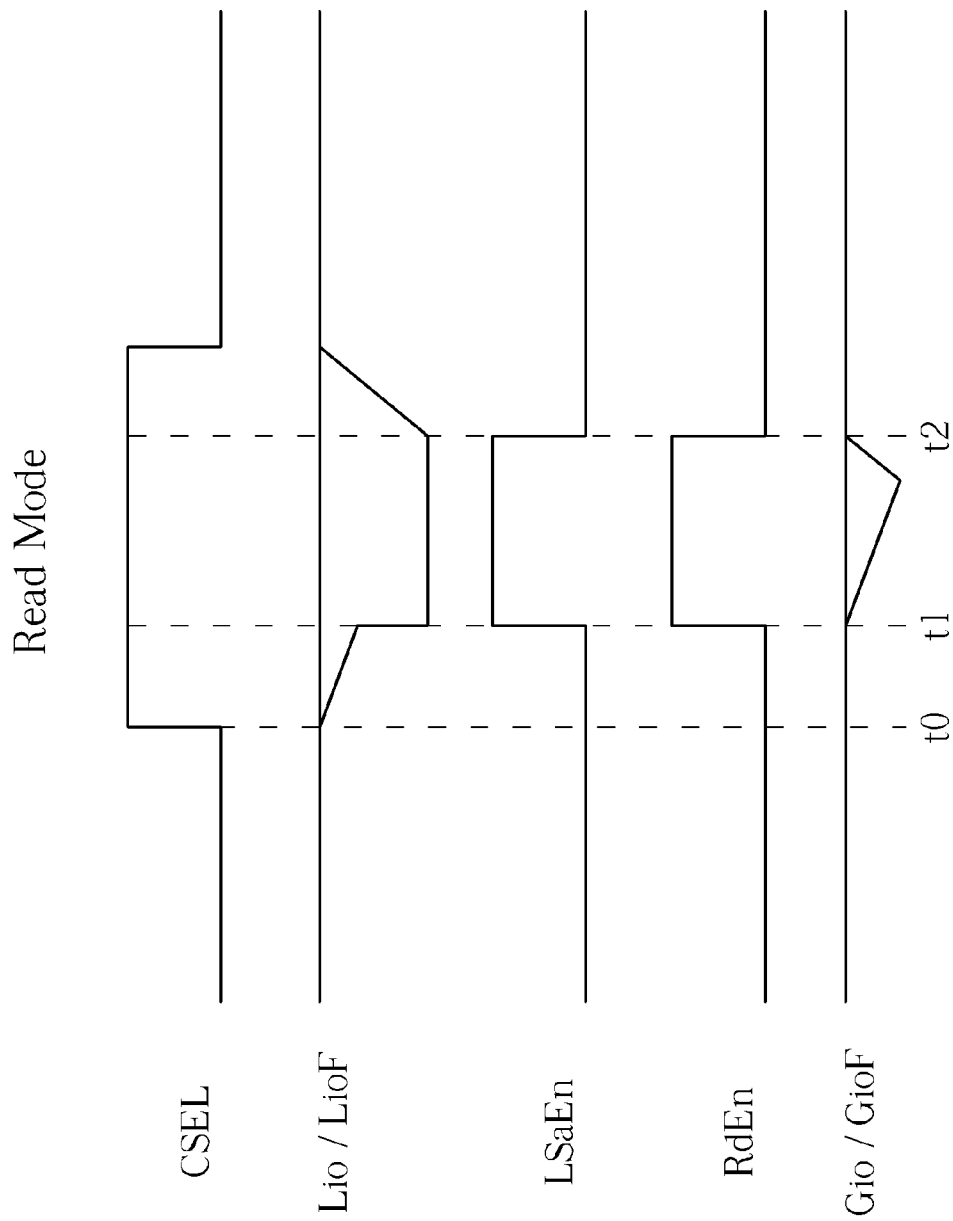
FIG. 4 is a timing diagram showing the relation between firing of signals and column separation for a read process of the memory array shown in FIG. 3.

In operation, the local sense accelerator 305 enables accelerated separation of the local bit lines during a read process. Initially, at a time $t_0$, the column selection enable signal (CSEL) as shown in FIG. 4, is fired. This selects a specific word line and causes a separation of the local bit lines, Lio and LioF (see Lio/LioF lines at $t_0$ in the timing diagram of FIG. 4). The cross-coupled transistors 311 and 312 sense the current present on the local bit lines, convert the current to a voltage, and amplify this signal. At this point, the grounded transistor 313 in the local sense accelerator 305 is inactive, or in a high impedance mode, so the local sense accelerator, or referred to more generally as a local acceleration block, 305 operates as a standard cross-coupled transistor pair.

When a predetermined threshold separation (typically about 300 mV) between the local bit lines, Lio and LioF, is reached, the local sense accelerator 305 causes the LSaEn signal to be fired, activating the grounded transistor 313. As demonstrated by the Lio/LioF lines of FIG. 4 as between $t_0$ and $t_1$, the line separation is initially gradual. Once activated, however, the third transistor 313 causes the cross-coupled transistors, 311 and 312, to latch one of the Lio/LioF lines, while quickly pulling down the other line, as shown at $t_1$ in the timing diagram of FIG. 4. The local bit lines, Lio and LioF, will therefore reach their maximum separation much faster than in the prior art. If the RdEn is fired at the same time as the LSaEn, the values present on the bit lines can be read quickly from the memory 300, as shown at $t_1$ in the timing diagram of FIG. 4.

For a write process, the local sense accelerator 305 functions in much the same way as a read process. Until a predetermined minimum separation of the local bit lines is reached, the memory array 300 will function as a conventional memory array. The write process is triggered when the CSEL fires a specific word line, as shown at $t_0$ in the timing diagram of FIG. 5. This causes separation of the corresponding local bit lines to begin (see Lio/LioF at $t_0$ in timing diagram of FIG. 5). Once the minimum separation is reached, the local sense accelerator 305 will fire the LSaEn signal, as shown at $t_1$ in FIG. 5, turning on the third transistor 313 and latching one of the local bit lines, Lio or LioF, at a high potential while the other bit line quickly reaches a low potential. This increases the voltage present on the bit lines so that the capacitance is decreased. Additionally, the loading for the write process is not as heavy as in the conventional art.

In FIG. 4, the RdEn is shown as being fired at the same time, $t_1$, as the LSaEn. In practical terms, it may be desirable to have a slight delay between firing the LSaEn and the RdEn (or WrEn for a write process). This is because there may be a small delay between the LSaEn being fired and the latching and pulling down of the local bit lines by the local sense accelerator 305. The exact value of this delay may be determined via simulation.

In conclusion, the local sense accelerator of the present application may increase the speed of read and write processes for a memory array, while reducing power consumption. In addition, the layout area for the memory array including the local sense accelerator does not need to be increased.

Although this application has been described in terms of certain preferred embodiments, those skilled in the art will readily observe that numerous modifications and alterations of the device and method may be made while retaining the teachings of the application. Accordingly, the scope of the present application is defined only by reference to the appended claims and equivalents thereof.

Those skilled in the art will readily observe that numerous modifications and alterations of the device and method may be made while retaining the teachings of the invention.

What is claimed is:

1. A memory array, comprising:
   at least one differential local bit line pair;
   at least one differential global bit line pair;
   at least a column selection signal line, for charging the differential local bit line pair to a predetermined voltage;
   at least an enable signal line for coupling the differential local bit line pair to the differential global bit line pair when a voltage of the differential local bit line pair reaches a specific value; and
   a local sense accelerator, coupled to the differential local bit line pair, for determining the voltage of the differential local bit line pair, and enabling an accelerator signal line for latching one of the differential local bit line pair and pulling the other low when the voltage reaches the specific value.

2. The memory array of claim 1, wherein the local sense accelerator comprises:
   a pair of cross-coupled transistors, coupled between the differential local bit line pair; and
   a third transistor, coupled between the pair of cross-coupled transistors, and coupled to the accelerator signal line.

3. The memory array of claim 1, wherein the enable signal line is a write enable signal line for enabling a write process of the memory array.

4. The memory array of claim 1, wherein the enable signal line is a read enable signal line for enabling a read process of the memory array.

5. A method for accelerating data transfer in a memory array, comprising:
   providing at least one differential local bit line pair;
   providing at least one differential global bit line pair;
   generating a column selection signal to charge the differential local bit line pair to a predetermined value;
   generating an enable signal to couple the differential local bit line pair to the differential global bit line pair when the voltage of the differential local bit line pair reaches a specific value; and
   enabling an accelerator signal for latching one of the differential local bit line pair and pulling the other low when the voltage reaches the specific value.

6. The method of claim 5, wherein the step of enabling an accelerator signal for latching one of the differential local bit line pair and pulling the other low when the voltage reaches the specific value comprises:
   providing a local sense accelerator coupled between the differential local bit line pair; and
   utilizing the local sense accelerator to determine local voltage of the differential local bit line pair.

7. The method of claim 5, wherein the enable signal is a write enable signal for enabling a write process of the memory array.

8. The method of claim 5, wherein the enable signal is a read enable signal for enabling a read process of the memory array.

9. A memory array with a local acceleration block, the array comprising:
   at least one differential local bit line pair;
   at least one differential global bit line pair coupled to the at least one differential local bit line pair; and
   at least one enable line coupled to either the local bit line pair or the global bit line pair;
   wherein the local acceleration block is configured to selectively latch one of the differential local bit lines at a high voltage value while causing the other differential local bit line to go to a low voltage value.

10. The memory array of claim 9, wherein the local acceleration block further comprises a pair of transistors cross-coupled to the differential local bit line pair.

11. The memory array of claim 10, wherein the local acceleration block further comprises:
   a grounded transistor coupled, via its source, to the drains of the pair of cross-coupled transistors;
   wherein the gate of the grounded transistor is coupled to a local sense accelerator enable line, and the drain of the grounded transistor coupled to a ground potential.

12. The memory array of claim 10, wherein the cross-coupled transistor pair is configured such that the gate of the first of the transistors is coupled to the source of the second, the gate of the second is coupled to the source of the first, and each of the gate-source junctions are coupled to one of the differential local bit line pairs, respectively.

13. The memory array of claim 9, wherein the at least one enable line is a write enable line and is coupled to the differential local bit line pair and the differential global bit line pair via a pair of transistors.

14. The memory array of claim 13, wherein the pair of transistors are P-channel MOS devices.

15. The memory array of claim 9, wherein the at least one enable line is a read enable line and is coupled to the differential global bit line pair via a pair of transistors.

16. The memory array of claim 15, wherein the pair of transistors are N-channel MOS devices.

* * * * *